United States Patent
Weber et al.

(10) Patent No.: US 6,952,345 B2
(45) Date of Patent: Oct. 4, 2005

(54) METHOD AND APPARATUS FOR COOLING HEAT-GENERATING STRUCTURE

(75) Inventors: Richard M. Weber, Prosper, TX (US); George F. Barson, Plano, TX (US); Michael D. Koehler, Justin, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/698,953

(22) Filed: Oct. 31, 2003

(65) Prior Publication Data

US 2005/0094373 A1 May 5, 2005

(51) Int. Cl.⁷ .............................................. H05K 7/20
(52) U.S. Cl. ...................... 361/699; 165/80.4; 257/714; 257/715; 361/700
(58) Field of Search ................................. 361/689, 699, 361/700, 715–719; 257/714, 715; 165/80.4, 104.33; 174/15.1; 62/259.2

(56) References Cited

U.S. PATENT DOCUMENTS

| | | | | |
|---|---|---|---|---|
| 6,052,284 A | * | 4/2000 | Suga et al. | 361/699 |
| 6,292,364 B1 | * | 9/2001 | Fitzgerald et al. | 361/699 |
| 6,305,463 B1 | * | 10/2001 | Salmonson | 165/80.3 |
| 6,366,462 B1 | * | 4/2002 | Chu et al. | 361/699 |
| 6,536,516 B2 | * | 3/2003 | Davies et al. | 165/170 |
| 6,594,479 B2 | * | 7/2003 | Ammar et al. | 455/347 |

FOREIGN PATENT DOCUMENTS

| | | | |
|---|---|---|---|
| EP | 1 143 778 A1 | 10/2001 | |
| EP | 1 380 799 A2 | 1/2004 | ........... F25B/23/00 |
| EP | 1 381 083 A2 | 1/2004 | ......... H01L/23/427 |
| WO | WO 02/23966 A2 | 3/2002 | ............ H05K/7/00 |

* cited by examiner

*Primary Examiner*—Boris Chervinsky
(74) *Attorney, Agent, or Firm*—Baker Botts L.L.P.

(57) ABSTRACT

An apparatus includes a heat receiving portion which receives heat within a footprint from a heat generating structure, and a cooling arrangement which causes flow of a coolant that absorbs heat at the heat receiving portion, the cooling arrangement being disposed in its entirety within a width of the footprint in a particular direction. A different feature involves an apparatus which includes a heat receiving portion at which a coolant receives heat, and a coolant separating portion which receives coolant traveling away from the heat receiving portion, and which separates liquid coolant from vapor coolant.

22 Claims, 6 Drawing Sheets

METHOD AND APPARATUS FOR COOLING HEAT-GENERATING STRUCTURE

TECHNICAL FIELD OF THE INVENTION

This invention relates in general to cooling techniques and, more particularly, to a method and apparatus for cooling devices which generate a substantial amount of heat.

BACKGROUND OF THE INVENTION

Some types of electronic circuits use relatively little power, and produce little heat. Circuits of this type can usually be cooled satisfactorily through a passive approach, such as convection cooling. In contrast, there are other circuits which consume large amounts of power, and produce large amounts of heat. One example is the circuitry used in a phased array antenna system.

More specifically, a modern phased array antenna system can easily produce 25 to 30 kilowatts of heat, or even more. One known approach for cooling this circuitry is to incorporate a refrigeration unit into the antenna system. However, suitable refrigeration units are large, heavy, and consume many kilowatts of power in order to provide adequate cooling. For example, a typical refrigeration unit may weigh about 200 pounds, and may consume about 25 to 30 kilowatts of power in order to provide about 25 to 30 kilowatts of cooling. Although refrigeration units of this type have been generally adequate for their intended purposes, they have not been satisfactory in all respects.

In this regard, the size, weight and power consumption characteristics of these known refrigeration systems are all significantly larger than desirable for an apparatus such as a phased array antenna system. And given that there is an industry trend toward even greater power consumption and heat dissipation in phased array antenna systems, continued use of refrigeration-based cooling systems would involve refrigeration systems with even greater size, weight and power consumption, which is undesirable.

In addition, some phased array antenna systems include a number of modules, such as transmit-receive integrated microwave modules (TRIMMs) or "slats", that include a row of antenna elements and corresponding circuitry. For example, a module may include a row of sixteen antenna elements. In some cases, several such modules are arranged adjacent each other so that the rows of antenna elements on abutting modules line up to form a continuous row of antenna elements, and so that other modules define other similar rows. The result is a two-dimensional array of antenna elements.

For some applications, it is desirable to minimize the size of the antenna elements on each module, and the size of the module. For example, as the operational frequency of the antenna progressively increases, the size of the antenna elements needs to progressively decrease, and the size of the module needs to progressively decrease. However, reductions in the size of the antenna elements and the size of the module may be limited by the size and location of the circuitry required for the module. Thus, in some cases, it may be desirable to use the complete width of the module, from one edge to the other, to accommodate particular circuitry, such as transmit-receive modules (TRMs). There are existing cooling systems that utilize edge areas outside of the circuitry present on a module, but this prevents use of the entire width of the module for circuitry.

A further consideration is that, where the coolant is a two-phase coolant, a separator is sometimes provided to separate coolant in a vapor state from coolant in a liquid state. The separator is physically separate from all of the modules, and takes up valuable physical space, thus causing the cooling system to be less compact than would otherwise be desirable.

SUMMARY OF THE INVENTION

From the foregoing, it may be appreciated that a need has arisen for a method and apparatus for efficiently cooling heat-generating structure in a manner that avoids at least some of the disadvantages of prior approaches. One form of the invention relates to a cooling structure which includes a heat receiving portion, an inlet portion, an outlet portion, a coolant supply portion, and a coolant application portion, the heat receiving portion having a footprint with a width in a first direction, and being configured to receive heat within the footprint from a heat generating structure. This form of the invention involves: locating each of the inlet portion, the outlet portion, the coolant supply portion, and the coolant application portion within the width of the footprint with respect to the first direction; positioning the inlet portion and the outlet portion at locations spaced from the heat receiving portion with respect to a second direction approximately normal to the first direction; causing a fluid coolant to flow through the coolant supply portion from the inlet portion to the region of the heat receiving portion; and causing the coolant to flow through the coolant application portion from the region of the heat receiving portion to the outlet portion, the coolant receiving heat at the heat receiving portion after traveling through the coolant supply portion and before traveling through the coolant outlet portion.

A different form of the invention involves: providing a slat including a heat receiving portion and a cooling structure, the heat receiving portion being configured to receive heat from heat generating structure, and the cooling structure being configured to guide a two-phase fluid coolant past the heat receiving portion such that the coolant receives heat from the heat receiving portion and at least a portion of the coolant transitions from a liquid state to a vapor state in response to the absorption of heat; receiving at the coolant separating portion the coolant traveling away from the heat receiving portion; and separating liquid coolant from vapor coolant at the coolant separating portion.

BRIEF DESCRIPTION OF THE DRAWINGS

A better understanding of the present invention will be realized from the detailed description which follows, taken in conjunction with the accompanying drawings, in which.

DETAILED DESCRIPTION

Figure 1:
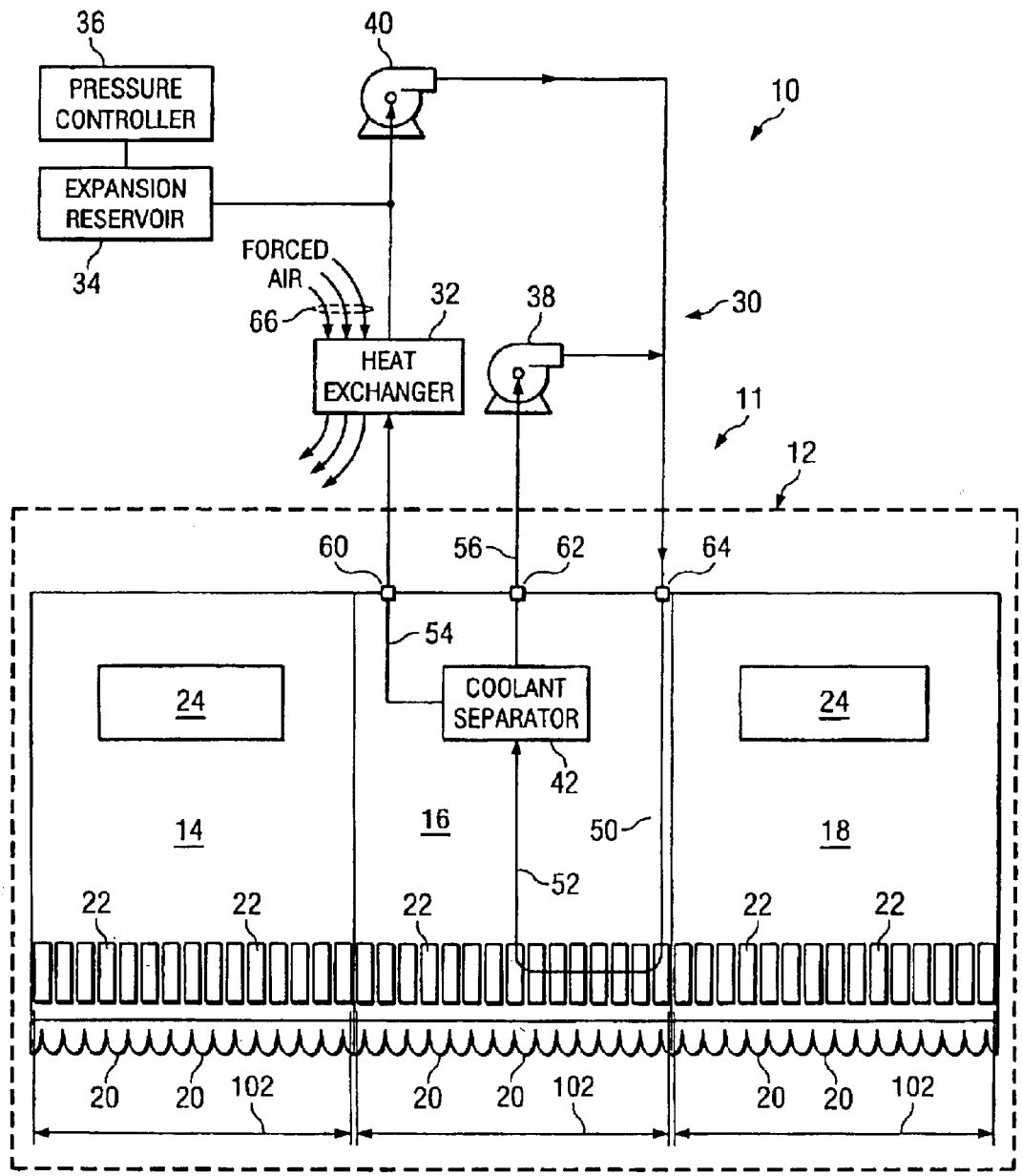
FIG. 1 is a block diagram of an apparatus which embodies aspects of the present invention, and shows part of a phased array antenna system, and a cooling system for the phased array antenna system.

FIG. 1 is a block diagram of an apparatus 10 which includes part of a phased array antenna system 12, and a cooling system 11 for the phased array antenna system 12. The antenna system 12 includes a plurality of identical modular parts that are commonly known as slats, three of which are depicted at 14, 16 and 18. The cooling system 11 is configured to cool one or more slats, so as to remove heat generated by electronic circuitry thereon. For clarity, FIG. 1 shows how the cooling system 11 is configured to cool the slat 16, but the cooling system 11 also cools other slats in a similar manner, including the slats 14 and 18.

The antenna system 12 includes a two-dimensional array of antenna elements 20, each row of the array of antenna elements 20 being provided on one or more slats. For example, in the embodiment shown in FIG. 1, one row of antenna elements 20 is provided on the slats 14, 16 and 18. The slats 14, 16 and 18 abut each other edge-to-edge to form a continuous row of antenna elements 20, as shown in FIG. 1.

Each slat 14, 16 and 18 includes various heat-generating electronic circuitry, including separate transmit/receive circuitry 22 for each antenna element 20. The transmit/receive circuitry 22 includes a transmit/receive module (TRM) for each antenna element 20 located near the front portions of slats 14, 16 and 18. The transmit/receive circuitry 22 generates most of the heat that needs to be removed from the slats. However, each slat 14, 16 and 18 also includes various other heat generating circuitry which requires cooling, such as circuitry 24 located near the rear portions of slats 14, 16 and 18. Although circuitry 24 is shown only on the slats 14 and 18 in FIG. 1, circuitry 24 is also provided on the slat 16, but has been omitted in FIG. 1 for clarity.

The cooling system 11 for the phased array antenna system 12 includes a circuit or loop, indicated by arrow 30, through which a fluid coolant is circulated in order to remove heat from the slat 16. The cooling system 11 includes cooling structure associated with the slat 16, a heat exchanger 32, an expansion reservoir 34, a pressure controller 36, a pump 38, a further pump 40, and a number of passageways through which the fluid coolant flows. The cooling structure associated with the slat 16 includes a separator module 42, which is discussed in more detail later. The cooling structure within the slat includes some passageways, which are illustrated and described in more detail later.

The fluid coolant flowing through the circuit 30 flows through the passageways in the cooling structure in order to remove heat generated by the various heat generating structures on the slat 16. The fluid coolant is a two-phase coolant, which enters the slat 16 in liquid form through an inlet 64. The fluid coolant is then routed toward the transmit/receive circuitry 22 near the front portion of the slat 16, as indicated by path 50 of the circuit 30.

As the liquid coolant flows through passageways adjacent the transmit/receive circuitry 22, the liquid coolant absorbs heat generated by the transmit/receive circuitry 22, which causes at least a portion of the liquid coolant to boil and vaporize, so that it absorbs a substantial amount of heat as it transitions from its liquid state to its vapor state. The resulting mixture of liquid coolant and vapor coolant then flows toward the separator module 42 located near the rear of the slat 16, as indicated by path 52 of the circuit 30.

The separator module 42 includes structure for separating the liquid coolant from the vapor coolant, which is illustrated and described in more detail later. This structure is also used to remove heat from adjacent heat generating structure on the slat 16.

The separator module 42 is configured so that the separated vapor coolant flows out of the separator module 42 and then out of the slat 16 through a vapor outlet 60, and then flows to the heat exchanger 32, as indicated by path 54 of the circuit 30. A small amount of liquid coolant may escape through the vapor outlet 60 with the vapor coolant.

The liquid coolant flowing through the separator module 42 absorbs heat generated by the circuitry 24, which causes a further portion of this liquid coolant to boil and vaporize. The separator module 42 is configured so that this additional vapor coolant flows toward and through the vapor outlet 60 discussed above. The remaining liquid coolant flows out of the separator module 42, through the liquid outlet 62, and toward the pump 38, as indicated by path 56 of the circuit 30. In this manner, the separator module 42 is able to remove additional heat from the slat 16, while separating most of the liquid coolant from the vapor coolant. Using the separator module 42 to remove most of the liquid coolant from the vapor coolant before the vapor coolant enters the heat exchanger 32 ensures increased or optimal efficiency of the heat exchanger 32.

The liquid coolant which exits the separator module 42 through the liquid outlet 62 is circulated back into the cooling structure of the slat 16 by the pump 38. The vapor coolant that exits the separator module 42 through the vapor outlet 60, which typically includes mostly vapor coolant and small amounts of liquid coolant, flows through the heat exchanger 32, which converts the vapor coolant to a liquid coolant. This liquid coolant is then circulated around the circuit 30 by the pump 40, so that it combines with the liquid coolant pumped through the pump 38, and re-enters the cooling structure of the slat 16 through the coolant inlet 64.

As the coolant flows through the heat exchanger 32, ambient air 66 is caused to flow through the heat exchanger 32, for example by a not-illustrated fan of a known type. Alternatively, if the antenna system 12 was on a ship, the flow 66 could be ambient seawater. The heat exchanger 32 transfers heat from the coolant to the air flow 66. The heat exchanger 32 thus cools the coolant, thereby causing the portion of the coolant which is in the vapor phase to condense back into its liquid phase. Using the separator module 42 to remove most of the liquid coolant from the vapor coolant before the vapor coolant enters the heat exchanger 32 ensures increased or. optimal efficiency of the heat exchanger 32. The coolant reaching the coolant inlet 64 of the slat 16 should be virtually all liquid, with no significant vapor entrained in the liquid stream, so that the coolant will be properly partitioned among the slats, and within each slat, so that the flow of coolant past each transmit/receive module is uniform. As one aspect of this, the liquid coolant should not pick up much heat in the passageways which carry the coolant to the heat-generating structure, because this could create vapor before the coolant is distributed. Uniform partitioning of the coolant helps to ensure uniform cooling across the antenna array, so as to avoid temperature gradients that could produce phase errors.

The expansion reservoir 34 and the pressure controller 36 work together to regulate the pressure of the fluid coolant within the circuit 30, as well as the proportion of liquid to vapor. The pressure controller 36 includes a vacuum pump which "pulls" on a transfer bladder within the expansion reservoir 34, in order to control the pressure within the circuit 30. The pressure controller 36 maintains the coolant within a portion of the circuit 30, from a location within the slat 16 to the inlet of the pump 40, at a subambient pressure, or in other words at a pressure which is less than the ambient air pressure. Typically, the ambient air pressure will be that of atmospheric air, which at sea level is 14.7 pounds per square inch area (psia). It should be understood that the path shown in FIG. 1 for the circuit 30 is intended only for general illustrative purposes, and does not represent the actual path of coolant through the slat 16.

Turning now in more detail to the coolant, one highly efficient technique for removing heat from a surface is to boil and vaporize a liquid which is in contact with the surface. As the liquid vaporizes, it inherently absorbs heat. The amount of heat that can be absorbed per unit volume of liquid is commonly known as the latent heat of vaporization of the liquid. The higher the latent heat of vaporization, the larger the amount of heat that can be absorbed per unit volume of liquid being vaporized.

The coolant used in the disclosed embodiment of FIG. 1 is water. Water absorbs a substantial amount of heat as it vaporizes, and thus has a very high latent heat of vaporization. However, water boils at a temperature of 100° C. at atmospheric pressure of 14.7 psia. In order to provide suitable cooling for an electronic apparatus such as the phased array antenna system 12, the coolant needs to boil at a temperature of approximately 60° C. When water is subjected to a subambient pressure of about 3 psia, its boiling temperature decreases to approximately 60° C. Thus, the expansion reservoir 34 and the pressure controller 36 maintain the water coolant at a pressure of approximately 3 psia along the portion of the circuit 30 from a location within the slat 16 to the inlets to the pumps 38 and 40.

Water flowing from the pumps 38 and 40 to the coolant inlet 64 has a temperature of approximately 65° C. to 70° C., and a pressure in the range of approximately 15 psia to 100 psia. The coolant inlet 64 controls the flow of water into the slat 16 such that, after passing through some apertures within the slat 16 (which are discussed later), the water still has a temperature of approximately 65° C. to 70° C., but has a much lower pressure, in the range about 2 psia to 8 psia. Due to this reduced pressure, some or all of the water will boil as a result of the absorption of heat as it passes through the coolant passageways formed in the slat 16, and some or all of the water will thus vaporize. After exiting the slat 16, the water vapor (and any remaining liquid water) will still have the reduced pressure of about 2 psia to 8 psia, but will have an increased temperature in the range of approximately 70° C. to 75° C.

When this subambient coolant water reaches the heat exchanger 32, heat is transferred from the water to the forced air flow 66. The air flow 66 has a temperature less than a specified maximum of 55° C., and typically has an ambient temperature below 40° C. As heat is removed from the water coolant, any portion of the water which is in its vapor phase will condense, such that all of the coolant water will be in liquid form when it exits the heat exchanger 32. This liquid will have a temperature of approximately 65° C. to 70° C., and will still be at the subambient pressure of approximately 2 psia to 8 psia. This liquid coolant will then be pumped by the pump 40, which increases the pressure of the coolant water to a value in the range of approximately 15 psia to 100 psia, as mentioned earlier.

It will be noted that the embodiment of FIG. 1 operates without any refrigeration system. In the context of high-power electronic circuitry, such as that utilized in the phased array antenna system 12, the absence of a refrigeration system can result in a very significant reduction in the size, weight, and power consumption of the structure provided to cool the antenna system 12.

The system of FIG. 1 is capable of cooling something from a temperature greater than that of ambient air or seawater to a temperature closer to that of ambient air or seawater. However, in the absence of a refrigeration system, the system of FIG. 1 cannot cool something to a temperature less than that of the ambient air or sea water. Thus, while the disclosed cooling system is very advantageous for certain applications such as cooling the phased array antenna system shown at 12 in FIG. 1, it is not suitable for use in some other applications, such as the typical home or commercial air conditioning system that needs to be able to cool a room to a temperature less than the temperature of ambient air or water.

As mentioned above, the coolant used in the embodiment of FIG. 1 is water. However, it would alternatively be possible to use other coolants, including but not limited to methanol, a fluorinert, a mixture of water and methanol, or a mixture of water and ethylene glycol (WEGL). These alternative coolants each have a latent heat of vaporization less than that of water, which means that a larger volume of coolant must be flowing in order to obtain the same cooling effect that can be obtained with water. As one example, a fluorinert has a latent heat of vaporization which is typically about 5% of the latent heat of vaporization of water. Thus, in order for a fluorinert to achieve the same cooling effect as a given volume or flow rate of water, the volume or flow rate of the fluorinert would have to be approximately 20 times the given volume or flow rate of water.

Despite the fact that these alternative coolants have a lower latent heat of vaporization than water, there are some applications where use of one of these other coolants can be advantageous, depending on various factors, including the amount of heat which needs to be dissipated. As one example, in an application where a pure water coolant may be subjected to low temperatures that might cause it to freeze when not in use, a mixture of water and ethylene glycol could be a more suitable coolant than pure water, even though the mixture has a latent heat of vaporization lower than that of pure water.

A further consideration is that, although the foregoing discussion is directed to use of a two-phase coolant at a sub-ambient pressure, it would alternatively be possible for the coolant to be a single phase coolant, and/or for the coolant to be at a pressure other than a sub-ambient pressure. And where a single phase coolant is used, the separator module 42 can be omitted from each of the slats 14, 16 and 18, along with one of the coolant outlets 60 and 62. In that case the intermediate passageway 92 would extend directly to the remaining coolant outlet 60 or 62.

The transmit/receive circuitry 22 includes a plurality of transmit/receive modules which are each associated with a respective antenna element 20 on the slat 16. In the embodiment shown in FIG. 1, the transmit/receive circuitry 22 includes a row of sixteen transmit/receive modules which each correspond to a respective one of the sixteen antenna elements 20 on the slat 16. The row of sixteen transmit/ receive modules provided on the slat 16 has an overall width which is indicated at 102. As discussed in greater detail below, the various coolant passageways and channels within the slat 16 do not extend beyond the width 102 of the transmit/receive modules. As a result, the transmit/receive circuitry 22 provided on each of the slats 14, 16 and 18 may extend completely or almost completely across the entire width of that slat, thereby allowing each of the transmit/ receive modules to be substantially aligned with its respective antenna element 20 and allowing a continuous and non-interrupted row of the antenna elements 20 to be formed across the slats 14, 16 and 18 when these slats abut each other side-by-side, as shown in FIG. 1.

Figure 2:
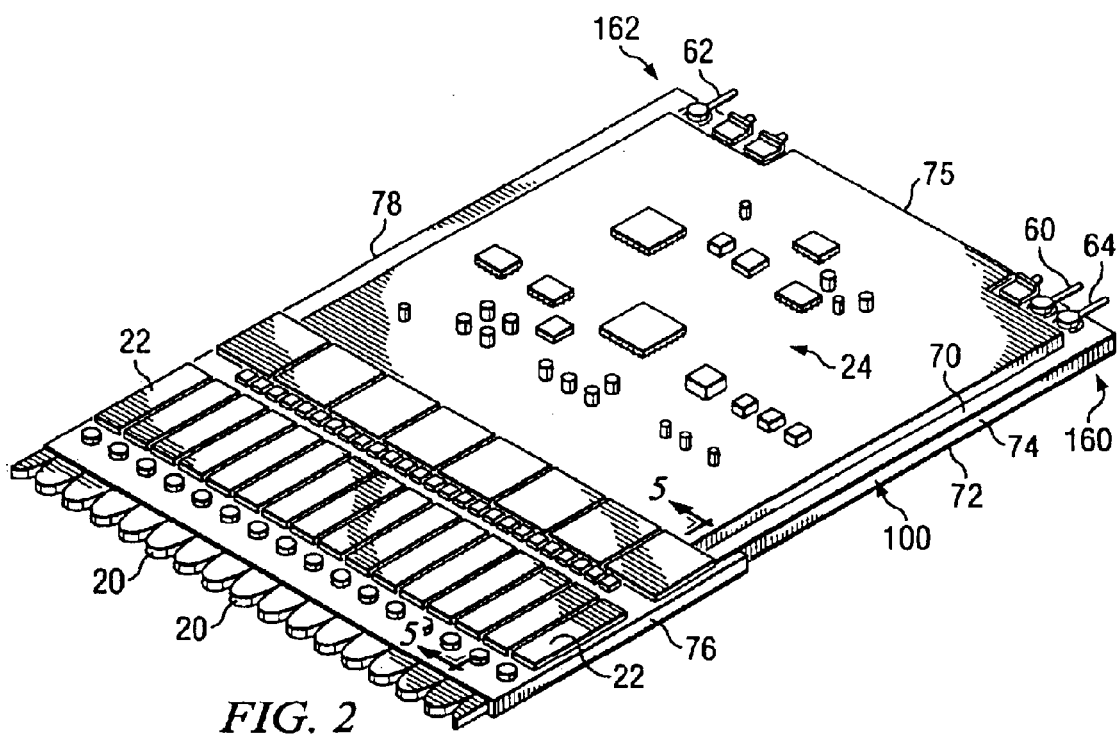
FIG. 2 is a perspective view of a slat which is a component of the phased array antenna system of FIG. 1.

FIG. 2 is a perspective view of the slat 16. The slat 16 includes an upper face sheet 70, a lower face sheet 72, and a core 74 sandwiched between the upper face sheet 70 and the lower face sheet 72. The core 74 and the sheets 70 and 72 collectively define a coldplate. The core 74 and the face sheet 70 are each thermally conductive. In the disclosed embodiment, the core 74 and face sheets 70 and 72 are each made from a metal.

The heat generating structure of the slat 16 is mounted to the upper face sheet 70, including the transmit/receive circuitry 22 located near the front end of the slat 16, circuitry 24 located adjacent the separator module 42 (which is not visible in FIG. 2), and various other circuitry on the slat 16. The cooling structure for removing heat from the slat 16, indicated generally in FIG. 2 at 100, includes various passageways and cavities for bringing the fluid coolant into thermal communication with portions of the heat generating structure on the slat 16. These passageways and cavities are formed in the core 74 between the upper face sheet 70 and the lower face sheet 72, as discussed in greater detail later.

The cooling structure 100 of the slat 16 includes a coolant inlet portion 160 and a coolant outlet portion 162, which are each disposed near a rear edge 75 of the slat 16. The coolant inlet portion includes the coolant inlet 64, and the coolant outlet portion 162 includes the vapor coolant outlet 60 and the liquid coolant outlet 62.

Figure 3:
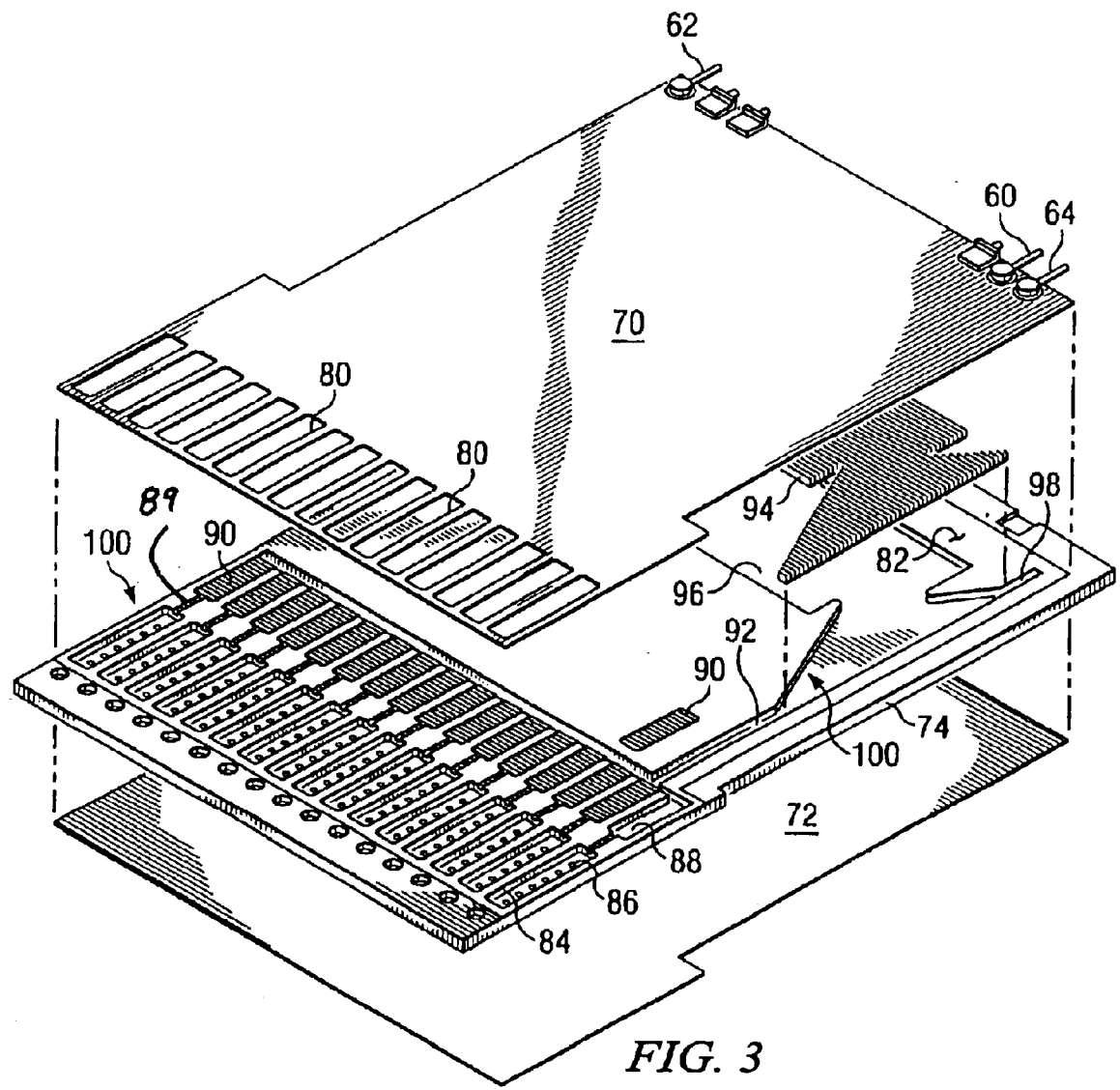
FIG. 3 is an exploded perspective view of the slat of FIG. 2, including an upper face sheet, a core, and a lower face sheet.

FIG. 3 is an exploded perspective view of the slat 16, showing the upper face sheet 70, the core 74, and the lower face sheet 72. The upper face sheet 70 includes mounting locations 80 for the transmit/receive modules (which are not visible in FIG. 3). The mounting locations 80 include an opening in the upper face sheet 70 for each transmit/receive module mounted on the slat 16.

FIG. 3 shows the top side of the core 74, as indicated at 82. When assembled with the upper face sheet 70, passageways provided in the top surface of the core 74 define a coolant application portion of the cooling structure 100 of the slat 16. In particular, a number of channels 84 are formed in the top side 82 of the core 74, and each correspond to one of the transmit/receive modules which are mounted on the upper face sheet 70. A set of one or more apertures 86 is formed in each channel 84, and allows the coolant to flow into each channel 84 from a coolant supply portion (which is not visible in FIG. 3). Coolant upstream of the apertures 86 has a higher pressure than coolant downstream of the apertures 86. In the disclosed embodiment, coolant downstream of the apertures has a sub-ambient pressure, as discussed earlier.

Liquid coolant within each channel 84 absorbs heat from a respective transmit/receive module of the circuitry 22 through the face sheet 70. As a result, at least a portion of this liquid coolant vaporizes. Each channel 84 is connected to a respective further channel 88 formed in the top side 82 of the core 74 by a respective inter-channel passageway 89. The liquid coolant in each channel 88 absorbs heat from heat-generating circuitry mounted on the upper face sheet 70 above the channels 88 and near the circuitry 22. A respective piece of finstock 90 is disposed in each channel 88 and is thermally coupled to the face sheet 70, in order to increase the amount of heat absorbed by the coolant within the channels 88. Although the disclosed embodiment uses finstock at 90 and at other locations (as discussed later), it would alternatively be possible to use some other suitable heat conductive material in place of the finstock, one example of which is a porous metal foam.

Each of the channels 88 communicates with a single intermediate passageway 92, which leads to the separator module 42. The separator module 42 includes a cavity 96 formed in the top side of the core 74, and a piece of finstock 94 disposed within the cavity The finstock 94 is thermally coupled to the face sheet 70, so that heat from the circuitry 24 (FIG. 2) will flow to the finstock 94. A vapor outlet channel 98 in the core 74 connects the cavity of the separator module 42 with the vapor outlet 60. Similarly, a liquid outlet channel 128 (FIG. 4B) connects the cavity of the separator module 42 with the liquid outlet 62.

For clarity, the slat 16 is shown in FIG. 3 with an orientation where the face sheets 70 and 72 extend generally horizontally. However, in a normal operational context, the slat 16 would be oriented so that the face sheets 70 and 72 extend approximately vertically, with the liquid outlet 62 disposed vertically lower than the vapor outlet 60 and the coolant inlet 64.

As discussed above, the cooling structure 100 of the slat 16 is configured so that the separator module 42 is located adjacent the circuitry 24 mounted on the upper face sheet 70. As liquid and vapor coolant enter the cavity 96, gravity will tend to cause the liquid coolant to flow downwardly within the cavity 96 toward the liquid outlet 62, while vapor coolant will tend to remain in the upper portion of the cavity 96 and flow to the vapor outlet 60. As the liquid coolant flows downwardly past the finstock 94, heat generated by the circuitry 24 and communicated thermally to the finstock 94 will be absorbed by the liquid coolant, thereby causing a portion of this liquid coolant to boil and vaporize. The resulting vapor coolant will rise and join the vapor coolant which entered the separator module 42 from the intermediate passageway 92, and thus will flow to the vapor outlet 60 through the vapor outlet channel 98. The remaining liquid coolant will continue downwardly and flow to the liquid outlet 62. The channels 84 and 88, the inter-channel passageways 89, the passageway 92, the cavity 96, the finstocks 90 and 94, and the passageways 98 and 128 serve as respective portions of a coolant application portion.

Figure 4A:
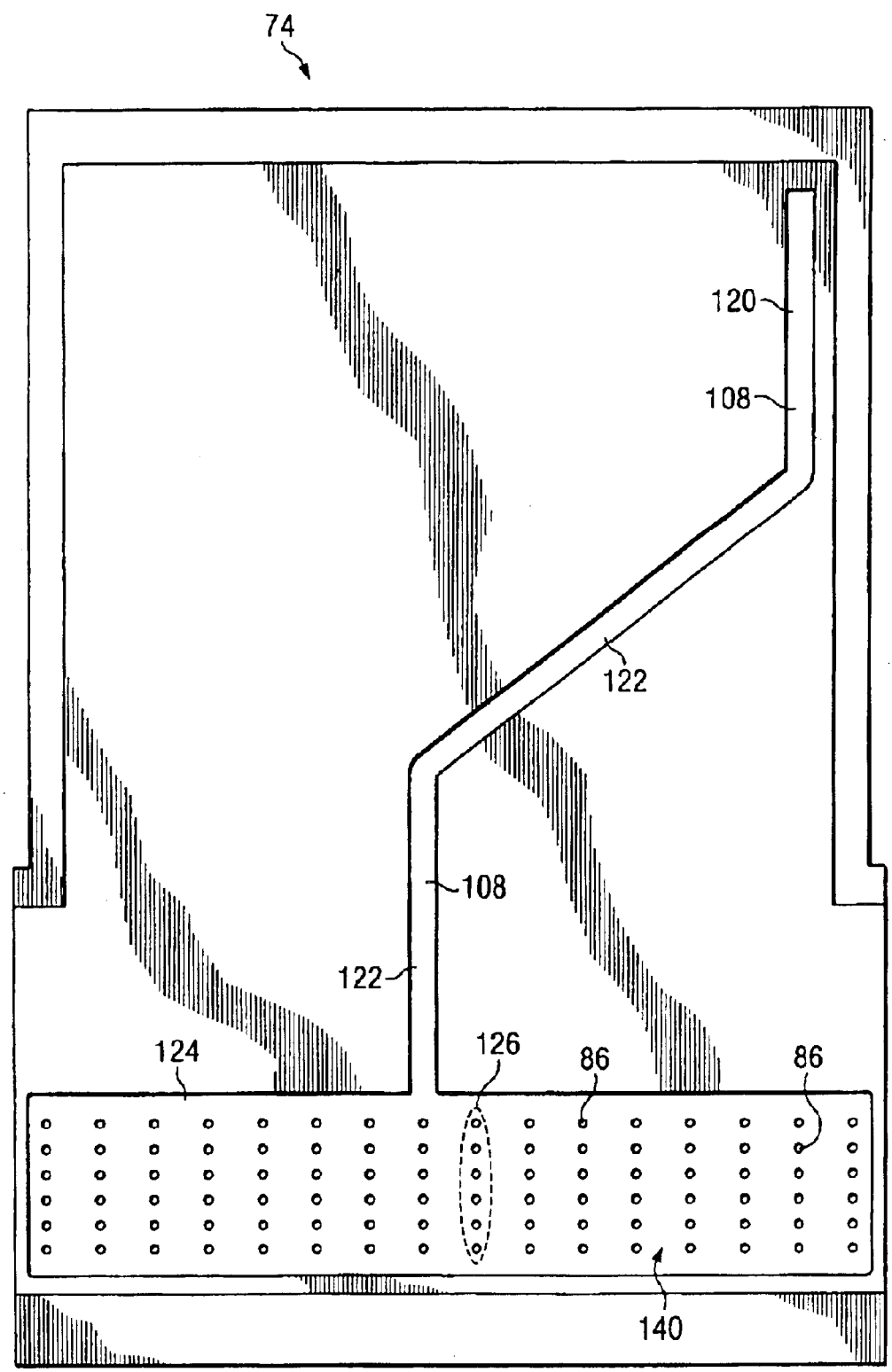
FIG. 4A is a bottom view of the core of the slat of FIG. 3.
Figure 4B:
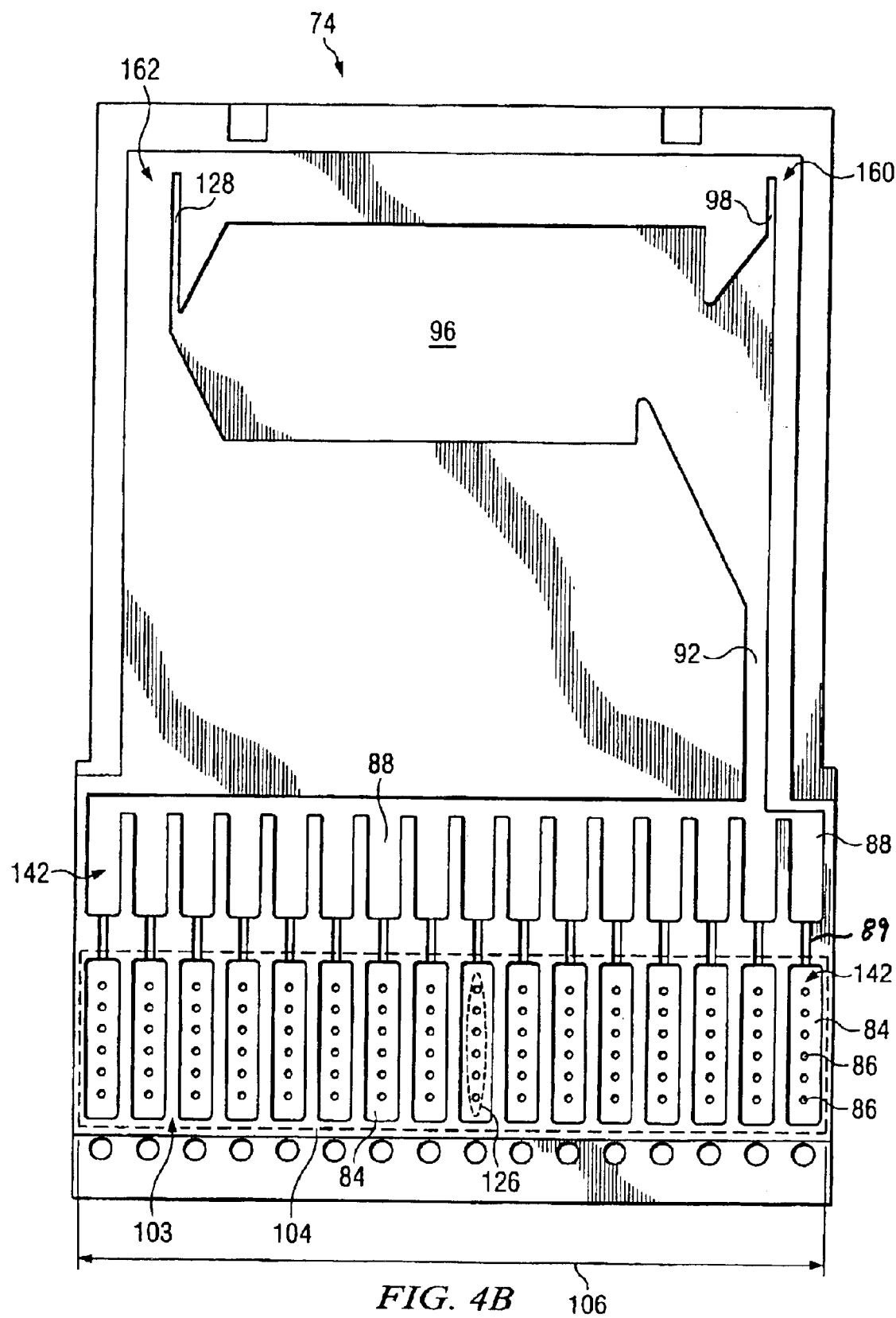
FIG. 4B is a top view of the core of the slat of FIG. 3.

FIGS. 4A and 4B are bottom and top views, respectively, of the core 74. It should be understood that relative directional terms used herein, such as "top", "bottom," "upper", "lower", "front", and "back", are used only for reference, as the orientation of the antenna system 12 may vary during actual use. Here, the "bottom" of the core 74 refers to the side of the core 74 which is adjacent the lower face sheet 72 of the slat 16, and "top" of the core 74 refers to the side of the core 74 which is adjacent the upper face sheet 70 of the slat 16.

As shown in FIG. 4A, the bottom side of the core 74 includes a plurality of coolant supply passageways 108 formed in the core 74, which serve as respective portions of a coolant supply portion of the cooling structure 100. These passageways include a coolant inlet channel 120, an intermediate supply channel 122, and a coolant supply cavity 124. The coolant inlet channel 120 receives liquid coolant from the coolant inlet 64 (FIG. 2). The coolant inlet channel 120 supplies this coolant through one or more intermediate supply channels 122 to the coolant supply cavity 124. The coolant supply cavity 124 communicates with the apertures 86 that lead to the channels 84 formed in the top side of the core 74 (FIG. 4B). Thus, the apertures 86 allow the fluid coolant to flow from the bottom side of the core 74 to the top side thereof. As mentioned above, a respective set of the apertures 86 is provided for each of the channels 84, so that the amount of liquid coolant flowing from the coolant supply cavity 124 into each of the channels 84 is substantially equal. One of these sets of apertures 86 is indicated at 126 in FIGS. 4A and 4B.

As shown in FIG. 4B, the apertures 86 allow the liquid coolant to enter the channels 84 from the bottom side of the core 74. As discussed above, as the liquid coolant flows through the channels 84, it absorbs heat from the transmit/receive modules of the adjacent circuitry 22, and a portion of the liquid coolant boils and vaporizes. This vapor coolant and the remaining liquid coolant then flow into the channels 88, which contain the finstocks 90 (FIG. 3). As the coolant passes through the channels 88, it absorbs heat generated by the circuitry mounted on the upper face sheet 70 above the channels 88.

The coolant then flows through the intermediate channel 92 and into the cavity 96 of the separator module 42, which contains the finstock 94. As discussed above, the liquid coolant is separated from the vapor coolant within the cavity 96 of the separator module 42, while absorbing through the finstock 94 the heat generated by the circuitry 24 mounted on the upper face sheet 70 above the channels 88. The separator module 42 is configured such that the separated vapor coolant, and possibly a small portion of the liquid coolant, is directed through the vapor outlet channel 98 toward the vapor outlet 60. The remaining liquid coolant is directed through the liquid outlet channel 128 toward the liquid outlet 62.

With reference to FIG. 4B, the cooling structure 100 includes a heat receiving portion 103, which receives heat from the heat-generating circuitry 22. The heat receiving portion 103 has a footprint indicated generally at 104. The width of the footprint 104 of the heat receiving portion 103 is indicated at 106. viewing FIGS. 3, 4A and 4B together, it can be seen that the coolant inlet portion 160, the coolant outlet portion 162, the coolant supply portion 140, and the coolant application portion 142 are all disposed in their entirety within the width 106 of the footprint 104 of the heat receiving portion 103. Stated differently, coolant can flow from the rear to the front of the slat 16 and then from the front to the rear of the slat 16, without the use of edge areas laterally beyond the width 106 of the heat-generating structure. This is due in part to the fact that the core 74 has passageways formed in both the top and bottom surfaces thereof, whereas pre-existing cores had passageways on only one side thereof.

Thus, as shown in FIG. 2, the transmit/receive circuitry 22 extends from a first edge 76 of the slat 16 to a second edge 78 of the slat 16, without the use of additional edge areas outside the width 106 of the transmit/receive circuitry 22 for the cooling structure 100. In addition, the row of antenna elements 20 provided on the slat 16 extends from the first edge 76 to the second edge 78 of the slat 16, so that a continuous row of antenna elements 20 can be formed by the antenna elements on multiple slats 14, 16 and 18.

Figure 5:
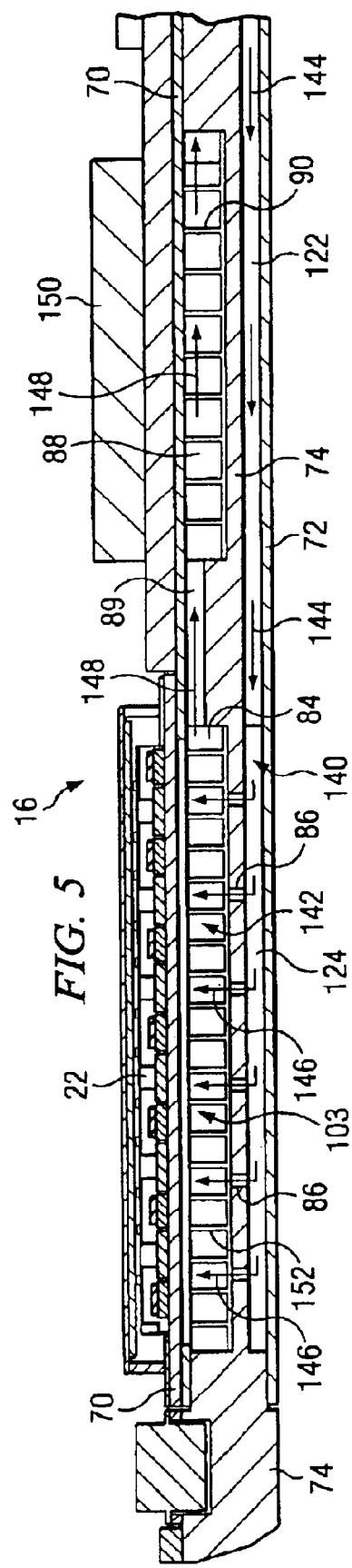
FIG. 5 is a fragmentary sectional view of a front portion of the slat of FIG. 2, taken along the line 5—5 in FIG. 2.

FIG. 5 is a fragmentary sectional view taken along the line 5—5 shown in FIG. 2, and shows a front portion of the slat 16 which is near the antenna elements 20. FIG. 5 illustrates the flow of coolant through the cooling structure 100 of the slat 16, which includes the coolant supply portion 140 near the lower face sheet 72 and the coolant application portion 142 near the upper face sheet 70. As discussed above, the coolant passageways in the coolant supply portion 140 are defined by the lower face sheet 72 and the recesses in the bottom side of the core 74. The coolant passageways in the coolant application portion 142 are defined by the upper face sheet 72 and the recesses in the top side of the core 74. It will be noted that the passageways of the coolant supply portion 140 are all proximate a plane corresponding to the bottom surface of the core 74, and the passageways of the coolant application portion 142 are all proximate a different plane corresponding to the top surface of the core 74.

In FIG. 5, the flow of coolant through the coolant passageways within the slat 16 is shown by a series of arrows. First, the coolant flows in liquid form through the intermediate supply channel 122 toward the coolant supply cavity 124, as indicated by arrows 144. The liquid coolant then flows from the coolant supply cavity 124 through the sets of apertures 86 and into the channels 84, as indicated by arrows 146. As the liquid coolant flows through the channels 84, the liquid coolant encounters the heat receiving portion 103 of the cooling structure 100, and is thus brought into thermal communication with the transmit/receive modules of the circuitry 22. Respective pieces of finstock 152 are attached to the upper face sheet 70 in alignment with each transmit/receive module and project into the channels 84, so as to increase the rate of heat transfer, from the transmit/receive modules to the coolant within the heat receiving portion 103.

Alternatively, the upper face sheet 70 could have several openings provided therethrough which each correspond in size and location to a respective one of the mounting locations 80 (FIG. 3), and each transmit/receive module 22 could be sealingly mounted to the face sheet 70 so as to cover a respective opening, in a manner preventing the escape of coolant. The pieces of finstock 152 would be replaced with pieces of finstock that are each directly mounted on a respective transmit/receive module 22, and that each project into the coolant through a respective one of the openings in the face sheet 70. Thus, heat would be transferred directly from each transmit/receive module 22 to a piece of finstock and then directly to the coolant, rather than traveling from each module 22 through the sheet 70 to the pieces of finstock 152.

As discussed above, a portion of the liquid coolant boils and vaporizes as it absorbs from the heat receiving portion 103 the heat generated by the transmit/receive modules within the circuitry 22. As the liquid coolant boils, it forms bubbles on surfaces from which it is absorbing heat, such as the surfaces of the finstock 152 disposed within the channels 84. The remaining liquid flowing through the channels 84 has the effect of washing these bubbles toward the separator module 42, which allows more boiling, and thus more heat removal.

The mixture of liquid and vapor coolant then flows through the inter-channel passageways 89 and into the channels 88, as indicated by arrows 148. As the coolant flows through the channels 88, heat is communicated from adjacent circuitry 150 to the finstock 90 within the channels 88, and is absorbed by the coolant. A portion of the liquid coolant boils and vaporizes, as discussed above. The resulting mixture of vapor and liquid coolant then flows through the intermediate channel 92 and into the not-visible separator module 42, where the liquid and vapor are separated and then directed out of the slat 16.

Although the present invention has been disclosed in the context of a phased array antenna system, it will be recognized that it can be utilized in a variety of other contexts, including but not limited to a power converter assembly, or certain types of directed energy weapon (DEW) systems.

The present invention provides a number of advantages. One such advantage is that the cooling structure of each slat is configured so that coolant is supplied in equal, parallel flows to each of the transmit/receive modules. Thus, the flow of coolant across the transmit/receive module corresponding with each antenna element has the same properties, including the same flow rate, pressure and temperature. This increases the uniformity of the cooling throughout the phased array antenna system, and thus minimizes temperature gradients.

Another advantage is that the cooling structure for each slat does not require any edge area outside the width of the heat-generating transmit/receive circuitry which is being cooled. As a result, the transmit/receive circuitry can extend across the complete width of the slat, which can help to reduce the size of the slat. In addition, the row of antenna elements provided by each slat can also extend across the complete width of the slat, so that a continuous row of antenna elements is formed by two or more adjacent slats.

Yet another advantage is that a combined coolant separator and heat exchanger is built into the cooling structure of the slat. As a result, there is no need for a separate coolant separator located external to the antenna array. In addition, the separator module is also able to absorb additional heat generated by circuitry located adjacent to the separator module.

Although one embodiment has been illustrated and described in detail, it will be understood that various substitutions and alterations are possible without departing from spirit and scope of the present invention, as defined by the following claims.

What is claimed is:

1. An apparatus comprising a cooling structure including:
   a heat receiving portion having a footprint and configured to receive heat within said footprint from a heat generating structure, said footprint having a width in a first direction;
   an inlet portion for a fluid coolant, said inlet portion being disposed within said width of said footprint with respect to said first direction;
   an outlet portion for said fluid coolant, said outlet portion being disposed within said width of said footprint with respect to said first direction, said inlet portion and said outlet portion being spaced from said heat receiving portion with respect to a second direction approximately normal to said first direction;
   a coolant supply portion configured to guide a fluid coolant from said inlet portion to the region of said heat receiving portion, said coolant supply portion being disposed in its entirety within said width of said footprint with respect to said first direction; and
   a coolant application portion configured to receive said coolant from said coolant supply portion and to guide said coolant from the region of said heat receiving portion to said outlet portion, said coolant application portion being disposed in its entirety within said width of said footprint with respect to said first direction, said coolant receiving heat at said heat receiving portion after traveling through said coolant supply portion and before traveling through said coolant application portion.

2. An apparatus according to claim 1,
   wherein said cooling structure has first and second sides disposed on opposite sides thereof, said inlet and outlet portions being disposed along said first side; and
   including an antenna element arrangement having a plurality of antenna elements disposed along said second side.

3. An apparatus according to claim 2, including circuitry which is supported on said cooling structure, which is electrically coupled to said antenna elements, and which has a portion serving as heat generating structure that supplies heat to said heat receiving portion.

4. An apparatus according to claim 1, wherein said coolant arrives at said heat receiving portion in the form of a liquid at a pressure lower than an ambient pressure of a surrounding environment, and at least some of said coolant boils and vaporizes at said heat receiving portion in response to the absorption of heat.

5. An apparatus according to claim 1,
   wherein said coolant supply portion includes a coolant supply passageway and said coolant application portion includes a coolant application passageway; and
   wherein said cooling structure includes an aperture upstream from said heat receiving region through which said coolant supply passageway communicates with said heat receiving region, said aperture having a cross-section substantially smaller than both a cross-section proximate said aperture of said coolant application passageway and a cross-section proximate said aperture of said coolant supply passageway.

6. An apparatus according to claim 1,
   wherein said coolant supply portion is formed generally proximate a first plane which is parallel to said first and second directions, and
   wherein said coolant application portion is formed generally proximate a second plane offset from and parallel with said first plane.

7. An apparatus according to claim 1,
   wherein said outlet portion of said cooling structure includes a liquid outlet and a vapor outlet separate from said liquid outlet; and
   wherein said coolant application portion includes a coolant separating portion configured to receive the coolant traveling away from said heat receiving portion, to separate liquid coolant from vapor coolant, and to guide said separated liquid coolant to said liquid outlet and said separated vapor coolant to said vapor outlet.

8. An apparatus according to claim 7, wherein said coolant separating portion includes an additional heat receiving portion configured to receive heat from an additional heat generating structure, said coolant receiving heat at said additional heat receiving portion while traveling through said coolant separating portion.

9. An apparatus according to claim 8, wherein said coolant separating portion includes a cavity and wherein said additional heat receiving portion includes a heat conductive structure disposed within said cavity, said coolant receiving heat from said heat conducting structure at said additional heat receiving portion.

10. An apparatus according to claim 8, wherein said coolant which receives heat at said additional heat receiving portion includes coolant which is in liquid form and which is at a pressure lower than an ambient pressure of a surrounding environment so that said liquid coolant boils and vaporizes in response to the absorption of heat.

11. An apparatus according to claim 1,
    wherein said coolant application portion includes a plurality of coolant application passageways oriented approximately parallel to each other; and
    wherein said cooling structure includes, for each of said coolant application passageways, a respective set of apertures upstream from said heat receiving portion, each said set of apertures allowing coolant to flow from said coolant supply portion into a respective one of said coolant application passageways.

12. An apparatus according to claim 1,
    wherein said coolant application portion of said cooling structure includes a plurality of coolant application passageways;
    wherein said heat receiving portion includes a plurality of heat receiving regions, each said heat receiving region being configured to receive heat within said footprint from one of a plurality of heat generating devices; and wherein each of said plurality of coolant application passageways corresponds with one of said plurality of heat receiving regions of said heat receiving portion.

13. An apparatus according to claim 12, wherein each of said coolant application passageways is aligned with a respective one of said heat receiving regions with respect to said first direction.

14. A method, comprising the steps of:

providing a cooling structure which includes a heat receiving portion, an inlet portion, an outlet portion, a coolant supply portion, and a coolant application portion, said heat receiving portion having a footprint with a width in a first direction and being configured to receive heat within said footprint from a heat generating structure;

locating each of said inlet portion, said outlet portion, said coolant supply portion, and said coolant application portion within said width of said footprint with respect to said first direction;

positioning said inlet portion and said outlet portion at locations spaced from said heat receiving portion with respect to a second direction approximately normal to said first direction;

causing a fluid coolant to flow through said coolant supply portion from said inlet portion to the region of said heat receiving portion; and causing said coolant to flow through said coolant application portion from the region of said heat receiving portion to said outlet portion, said coolant receiving heat at said heat receiving portion after traveling through said coolant supply portion and before traveling through said coolant outlet portion.

15. A method according to claim 14, including:

configuring said cooling structure to have first and second sides disposed on opposite sides thereof, said inlet and outlet portions being disposed along said first side; and providing an antenna element arrangement having a plurality of antenna elements disposed along said second side.

16. A method according to claim 15, including:

supporting circuitry on said cooling structure, said circuitry being electrically coupled to said antenna elements, and having a portion which serves as heat generating structure that supplies heat to said heat receiving portion.

17. A method according to claim 14, including:

configuring said coolant supply portion to include a coolant supply passageway;

configuring said coolant application portion to include a coolant application passageway;

configuring said cooling structure to include upstream from said heat receiving portion an aperture through which said coolant supply passageway communicates with said heat receiving portion, said aperture having a cross-section substantially smaller than both a cross-section proximate said aperture of said coolant application passageway and a cross-section proximate said aperture of said coolant supply passageway; and causing coolant to flow from said coolant supply portion through said aperture to said heat receiving portion.

18. A method according to claim 14, including causing coolant flowing through said heat receiving portion and said coolant application portion to be a two-phase coolant having a pressure lower than an ambient pressure of a surrounding environment, such that at least some of said coolant boils and vaporizes at said heat receiving portion in response to the absorption of heat.

19. A method according to claim 14, including configuring said cooling structure so that said coolant supply portion is formed generally proximate a first plane which is parallel to said first and second directions, and so that said coolant application portion is formed generally proximate a second plane spaced from and parallel with said first plane.

20. A method according to claim 14, including:

selecting as said coolant a two-phase coolant having a liquid state and a vapor state;

configuring said outlet portion of said cooling structure to include a liquid outlet and a vapor outlet separate from said liquid outlet;

receiving in a coolant separating portion from said heat receiving portion coolant which includes a mixture of liquid coolant and vapor coolant;

separating said liquid coolant from said vapor coolant in said coolant separating portion;

supplying said separated liquid coolant to said liquid outlet; and supplying said separated vapor coolant to said vapor outlet.

21. A method according to claim 20, wherein said coolant separating portion includes an additional heat receiving portion configured to receive heat from an additional heat generating structure; and including causing liquid coolant received in said coolant separating portion from said heat receiving portion to receive heat at said additional heat receiving portion.

22. A method according to claim 14, including:

configuring said coolant application portion of said cooling structure to include a plurality of coolant application passageways oriented approximately parallel to each other;

configuring said cooling structure to include, for each of said coolant application passageways, a respective set of apertures disposed upstream from said heat receiving portion; and causing respective portions of said coolant to flow from said coolant supply portion to each of said coolant application passageways through a respective said set of apertures.

* * * * *